(12) United States Patent
Hatori

(10) Patent No.: US 8,395,410 B2
(45) Date of Patent: Mar. 12, 2013

(54) SEMICONDUCTOR INTEGRATED CIRCUIT AND SYSTEM OF CONTROLLING THE SAME

(75) Inventor: Fumitoshi Hatori, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 200 days.

(21) Appl. No.: 13/036,349

(22) Filed: Feb. 28, 2011

(65) Prior Publication Data

US 2012/0062314 A1 Mar. 15, 2012

(30) Foreign Application Priority Data

Sep. 10, 2010 (JP) ................... 2010-202961

(51) Int. Cl.
*H03K 17/16* (2006.01)
*H03K 19/003* (2006.01)

(52) U.S. Cl. .......... 326/21; 327/540; 327/544; 327/564; 713/401

(58) Field of Classification Search ............ 326/21, 326/93; 327/540, 544, 564; 713/400–401
See application file for complete search history.

(56) References Cited

U.S. PATENT DOCUMENTS

| | | | | |
|---|---|---|---|---|
| 6,888,395 | B2 * | 5/2005 | Mizuno et al. | 327/333 |
| 7,161,414 | B2 * | 1/2007 | Mizuno | 327/544 |
| 8,089,378 | B1 * | 1/2012 | Stoler et al. | 341/61 |
| 2005/0232053 | A1 * | 10/2005 | Azuma et al. | 365/226 |
| 2008/0086650 | A1 | 4/2008 | Ozawa | |
| 2009/0267686 | A1 * | 10/2009 | Azuma et al. | 327/544 |

FOREIGN PATENT DOCUMENTS

JP 2008-098774 4/2008

OTHER PUBLICATIONS

Long et al, Techniques of Power-Gating to Kill Sub-Threshhold Leakage, Circuit & Systems, IEEE Asai Pacific Conference, APC-CAS 2006.
Jiang et al, Benefits and Costs of Power-Gating Technique, Proceedings of the 2005 Conference on Computer Design (ICCD'05).

* cited by examiner

*Primary Examiner* — Jason M Crawford
(74) *Attorney, Agent, or Firm* — Turocy & Watson, LLP

(57) ABSTRACT

According to one embodiment, a semiconductor integrated circuit includes a first circuit, a second circuit, and a signal propagation control circuit. The first circuit is configured to have a first power supply terminal. The second circuit is configured to have a second power supply terminal independent of the first power supply terminal. The signal propagation control circuit is configured to provide a first fixed value to the second circuit for a predetermined period after power is supplied to the second circuit, and after the predetermined period, configured to control whether to transfer an output signal from the first circuit to the second circuit or provide the first fixed value to the second circuit.

20 Claims, 5 Drawing Sheets

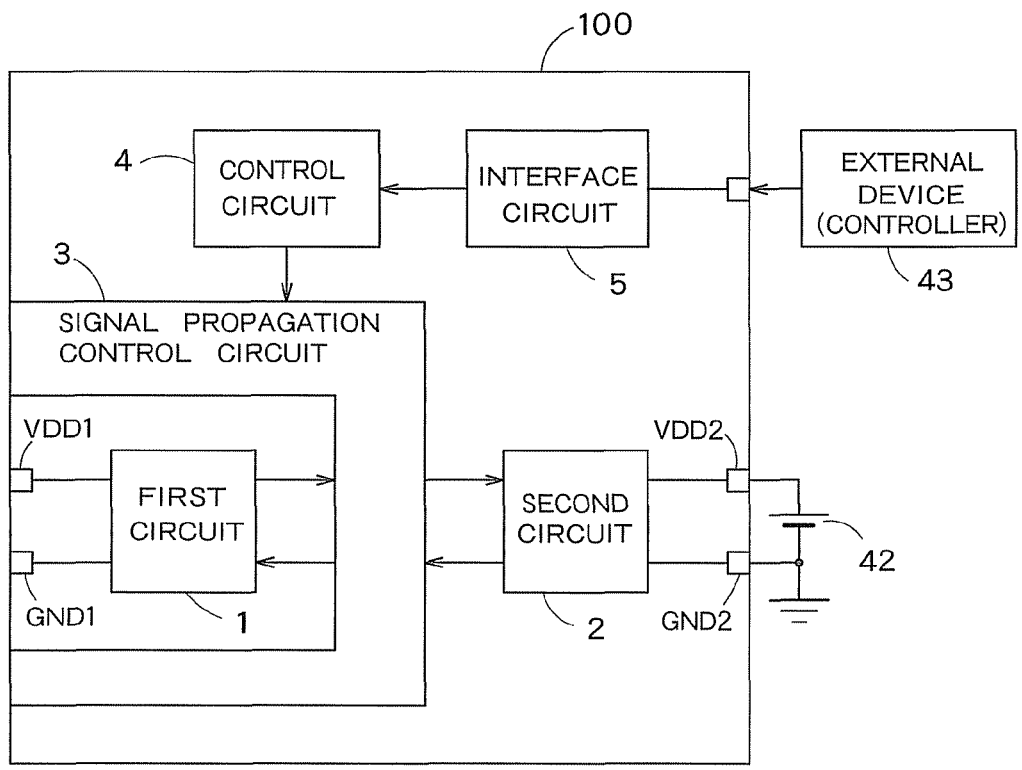
F I G. 5
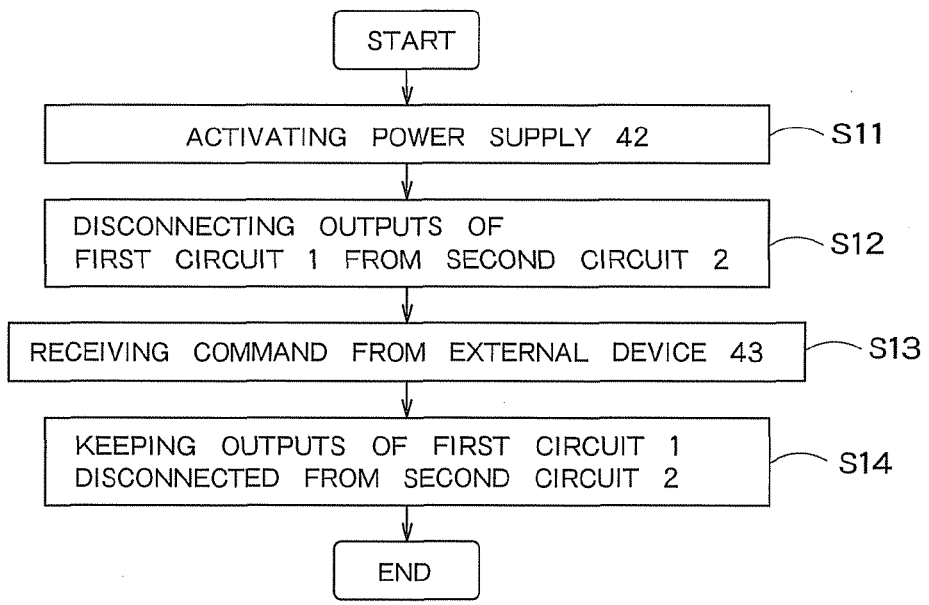
F I G. 6

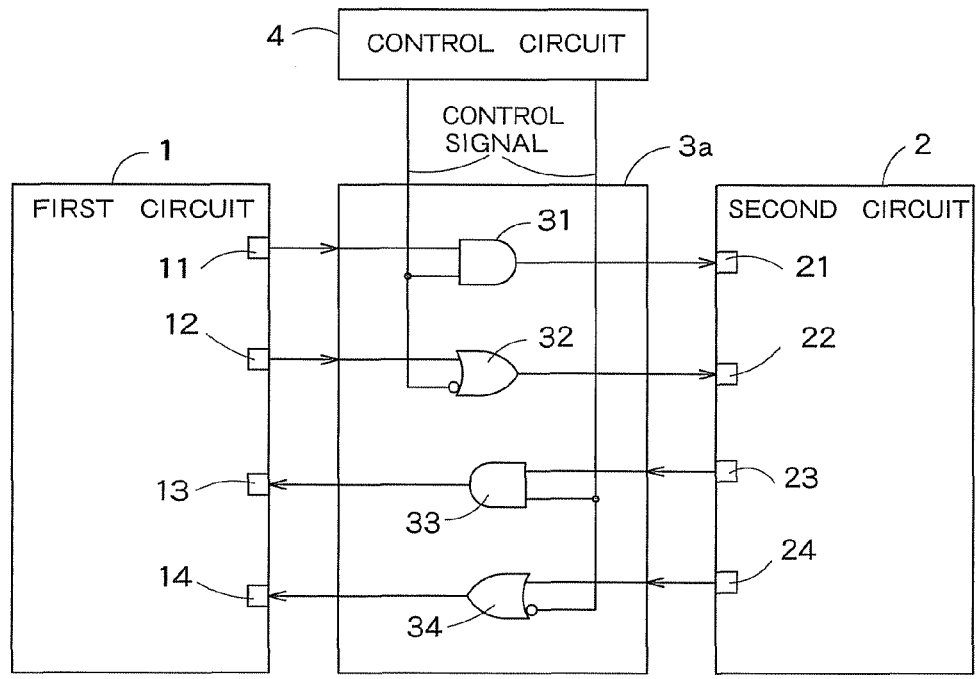
F I G. 7
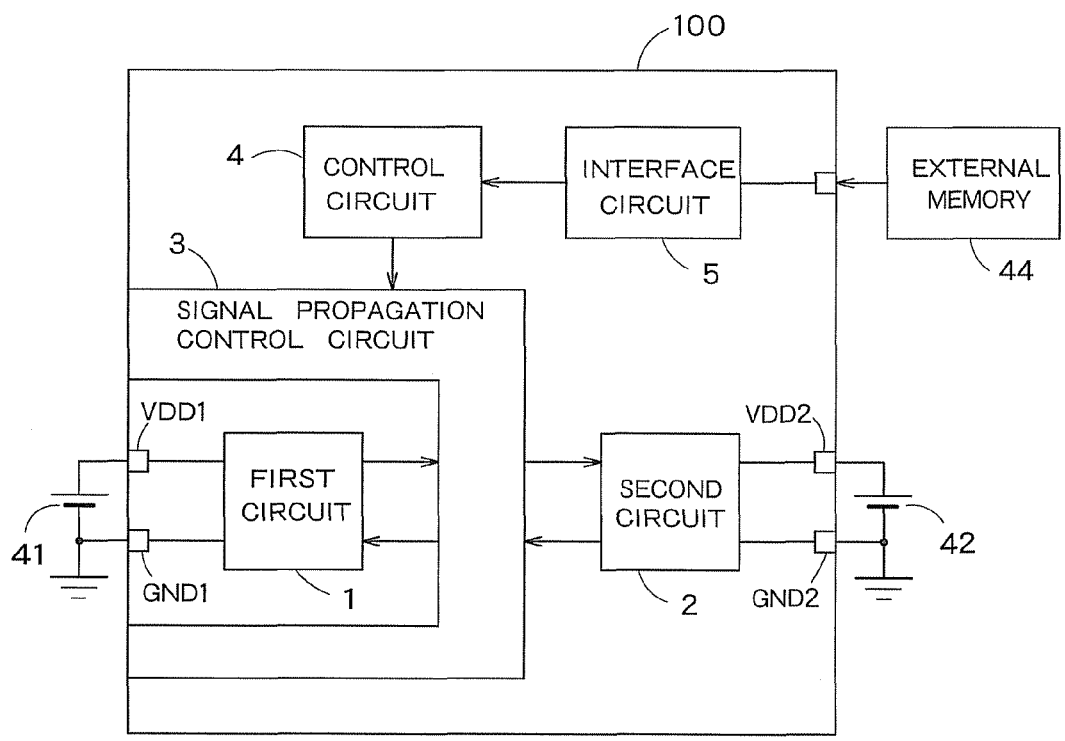
F I G. 8

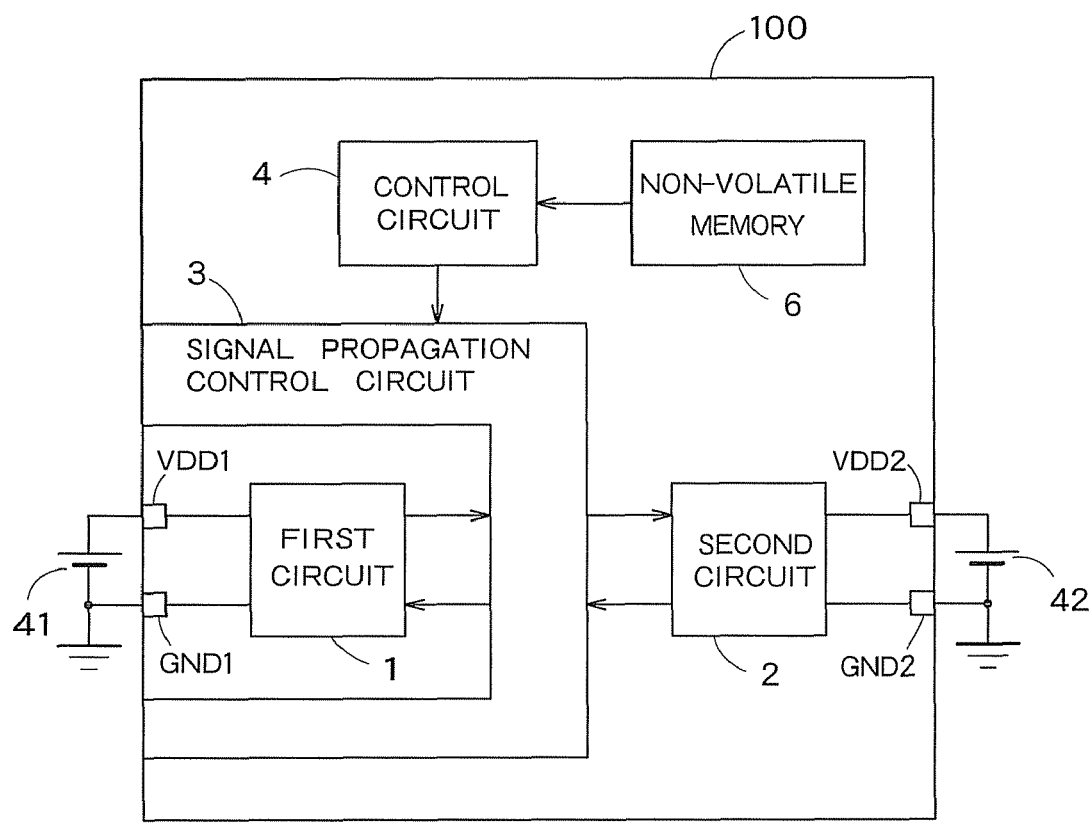
F I G. 9

US 8,395,410 B2

SEMICONDUCTOR INTEGRATED CIRCUIT AND SYSTEM OF CONTROLLING THE SAME

CROSS REFERENCE TO RELATED APPLICATIONS

This application is based upon and claims the benefit of priority from the prior Japanese Patent Application No. 2010-202961 filed on Sep. 10, 2010, the entire contents of which are incorporated herein by reference.

FIELD

Embodiments described herein relate generally to a semiconductor integrated circuit and a system of controlling the same.

BACKGROUND

Recently, due to downsizing of semiconductor devices, a lot of functions are implemented on a semiconductor integrated circuit. In order to realize general-purpose properties, it is common that circuits which are used for a certain application but not used for another application are implemented on a semiconductor integrated circuit and selected by users whether a specific function is used or not.

If power is not supplied to a circuit which is not used for a certain application to reduce the power consumption, output signals of the circuit become uncertain values or high impedance state. If a signal of the uncertain value or the high impedance is connected to another circuit being used, leakage current may occur and result in large power consumption, or the circuit may malfunction. To prevent the problem, there is a solution to provide signal propagation control circuit on the integrated circuit between the circuits and prevent the propagation of the uncertain value or the high impedance to the circuit being used. In this case, a dedicated terminal is necessary to define the usage of the function because the information whether a function is used or not, is necessary to control the signal propagation control circuit during the ramp-up period of the integrated circuit. However it increases the number of terminals of the integrated circuit.

If the additional terminal is not allowed due to area constraints, the signal propagation control circuit cannot be used. Therefore, even a circuit which is not used for a certain application must be provided with power and it may result in large power consumption.

BRIEF DESCRIPTION OF THE DRAWINGS

FIG. 5 is a block diagram showing an example of the connection of the semiconductor integrated circuit 100 when the first circuit 1 is not used.

FIG. 6 is a flowchart showing an example of the controlling sequence of the semiconductor integrated circuit 100 when the first circuit 1 is not used.

FIG. 7 is a circuit diagram showing an example of the internal configuration of the signal propagation control circuit 3a.

FIG. 8 is a block diagram showing an example of the connection of the semiconductor integrated circuit 100 when a firmware for controlling the semiconductor integrated circuit 100 is stored in an external memory 44.

FIG. 9 is a block diagram showing an example of the connection of the semiconductor integrated circuit 100 when the firmware is stored in an integrated non-volatile memory 6.

DETAILED DESCRIPTION

In general, according to one embodiment, a semiconductor integrated circuit includes a first circuit, a second circuit, and a signal propagation control circuit. The first circuit is configured to have a first power supply terminal. The second circuit is configured to have a second power supply terminal independent of the first power supply terminal. The signal propagation control circuit is configured to provide a first fixed value to the second circuit for a predetermined period after power is supplied to the second circuit, and after the predetermined period, configured to control whether to transfer an output signal from the first circuit to the second circuit or provide the first fixed value to the second circuit.

Embodiments will now be explained with reference to the accompanying drawings.

First Embodiment

Figure 1:
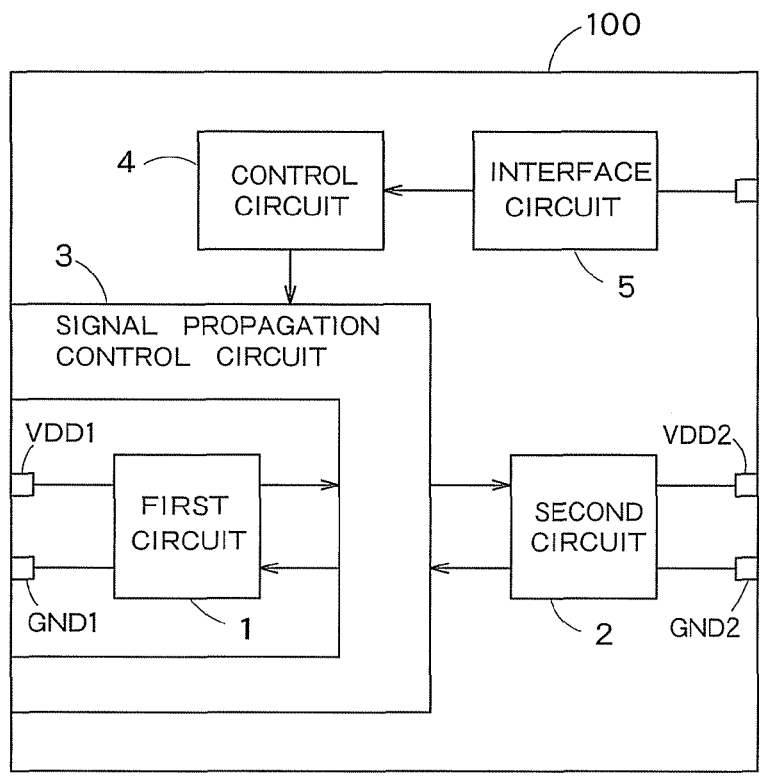
FIG. 1 is a schematic block diagram of a semiconductor integrated circuit 100 according to a first embodiment.

FIG. 1 is a schematic block diagram of a semiconductor integrated circuit 100 according to the first embodiment. The semiconductor integrated circuit 100 of FIG. 1 has a first circuit 1, a second circuit 2, a signal propagation control circuit 3, a control circuit 4 and an interface circuit 5. The semiconductor integrated circuit 100 of FIG. 1 provides a wireless communication function, for example.

The first circuit 1 is, for example, a USB (Universal Serial Bus) interface circuit or an SD card interface circuit. The first circuit 1 operates by connecting a power supply between a power terminal VDD1 and a ground terminal GND1 from outside. The first circuit 1 is used or not used according to the application. When used, the first circuit 1 and the second circuit 2 communicate each other through connecting signals therebetween.

The second circuit 2 is, for example, a wireless communication protocol processing circuit. The second circuit 2 operates by connecting a power supply between a power terminal VDD2 and a ground terminal GND2 from outside. The power supply terminal VDD1 is electrically isolated from the power supply terminal VDD2. Furthermore, the power supply voltage provided to the second circuit 2 can be different value from that provided to the first circuit 1. The second circuit 2 is always used regardless of the application as long as the semiconductor integrated circuit 100 is used.

For example, when the semiconductor integrated circuit 100 of FIG. 1 is mounted on a cellular phone, the first circuit 1 is not used and only the second circuit 2 is used. On the other hand, when the semiconductor integrated circuit 100 is mounted on a personal computer, both of the first and the second circuits 1 and 2 are used.

The signal propagation control circuit 3 controls whether to propagate the signals from the first circuit 1 to the second circuit 2. More specifically, when the first circuit 1 is used, the signal propagation control circuit 3 transfers the output signals from the first circuit 1 to the second circuit 2, and when the first circuit 1 is not used, the signal propagation control circuit 3 provides fixed values, which are the power supply voltage or the ground voltage, to the second circuit 2. If signals of uncertain value or high impedance state are connected to the second circuit 2, leakage current may occur. However, by providing the signal propagation control circuit 3, it can be avoided to provide the uncertain values to the second circuit 2 even though the power supply of the first circuit 1 is disconnected. Note that in the present embodiment, the signal propagation control circuit 3 transfers the signals from the second circuit 2 to the first circuit 1 regardless of the usage of the first circuit 1.

The control circuit 4 provides the signal propagation control circuit 3 with a control signal (first control signal) indicative of whether or not to transfer the signals from the first circuit 1 to the second circuit 2. More specifically, when the control signal is the power supply voltage, the control circuit 4 controls the signal propagation control circuit 3 to transfer the output signals from the first circuit 1 to the second circuit 2, and when the control signal is the ground voltage, the control circuit 4 controls the signal propagation control circuit 3 not to transfer the output signals from the first circuit 1 to the second circuit 2 and to provide fixed values which are the power supply voltage or the ground voltage. The control circuit 4 is, for example, composed of a circuit containing a microprocessor, and generally, controls not only the signal propagation control circuit 3 but also other circuit blocks.

One of the characteristic features, which will be described below, is that the control circuit 4 controls the signal propagation control circuit 3 not to transfer the signals from the first circuit 1 to the second circuit 2 for a predetermined period after the first and the second circuits 1 and 2 are started. Furthermore, because the signal propagation control circuit 3 is controlled by the control signal from the control circuit 4, it is unnecessary to have, on the semiconductor integrated circuit 100, a dedicated terminal to control the signal propagation control circuit 3.

The interface circuit 5 is an interface for communication with an external device (not shown) connected to the semiconductor integrated circuit 100. The external device is a host device for sending commands after the semiconductor integrated circuit 100 is started, or a memory storing a firmware executed by the semiconductor integrated circuit 100.

Figure 2:
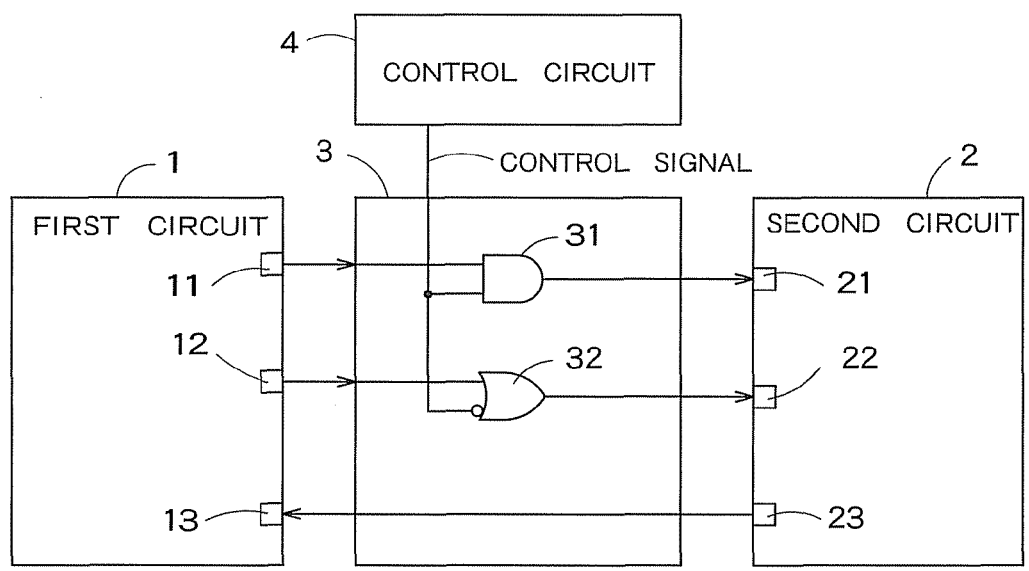
FIG. 2 is a circuit diagram showing an example of an internal configuration of the signal propagation control circuit 3.

FIG. 2 is a circuit diagram showing an example of an internal configuration of the signal propagation control circuit 3. The signal propagation control circuit 3 has an AND circuit 31 and an OR circuit 32.

The control signal and an output signal from an output terminal 11 of the first circuit 1 are connected to the input terminals of the AND circuit 31, and the output signal thereof is connected to an input terminal 21 of the second circuit 2. When the control signal is set to the power supply voltage, the output signal of the AND circuit 31 coincides with the output signal from the output terminal 11. As the result, the signal is transferred from the first circuit 1 to the second circuit 2. On the other hand, when the control signal is set to the ground voltage, the AND circuit 31 outputs the ground voltage regardless of the value of the output signal from the output terminal 11, even if the output signal from the output terminal 11 is the uncertain value or the high impedance. Therefore, the input to the input terminal 21 of the second circuit 2 can be fixed to the ground voltage.

An inverted signal of the control signal and an output signal from an output terminal 12 of the first circuit 1 are connected to the input terminals of the OR circuit 32, and the output signal thereof is connected to an input terminal 22 of the second circuit 2. When the control signal is set to the power supply voltage, the output signal of the OR circuit 32 coincides with the output signal from the output terminal 12. As the result, the signal is transferred from the first circuit 1 to the second circuit 2. On the other hand, when the control signal is set to the ground voltage, the OR circuit 32 outputs the power supply voltage regardless of the value of the output signal from the output terminal 12, even if the output signal from the output terminal 12 is the uncertain value or the high impedance. Therefore, the input to the input terminal 22 of the second circuit 2 can be fixed to the power supply voltage.

As stated above, the AND circuit can be used for the input terminals which require the ground voltage as the fixed input value. On the other hand, the OR circuit can be used for the input terminals which require the power supply voltage as the fixed input value. Of course, when all of the input terminals require the ground voltage, only AND circuits can be used, and when all of the input terminals require the power supply voltage, only OR circuits can be used. That means, the signal propagation control circuit 3 may have at least one of the AND circuits or the OR circuits. The required input value for each terminal of the second circuit 2 is determined based on the specification of the second circuit 2.

Here, in the present embodiment, the output signal from an output terminal 23 of the second circuit 2 is connected to an input terminal 13 of the first circuit 1 directly.

Furthermore, when the voltage used in the first circuit 1 is different from that used in the second circuit 2, the AND circuit 31 and the OR circuit 32 have, if needed, a voltage shifting function. For example, when the power supply voltage VDD1 is different from the power supply voltage VDD2, the voltage of the input terminals of the AND circuit 31 and the OR circuit 32 is the ground voltage or the power supply voltage VDD1, while the voltage of the output terminals is the ground voltage or the power supply voltage VDD2, and the signal propagation control circuit 3 is so designed that undesired leakage current does not occur even if the voltage shifting function is implemented.

Figure 3:
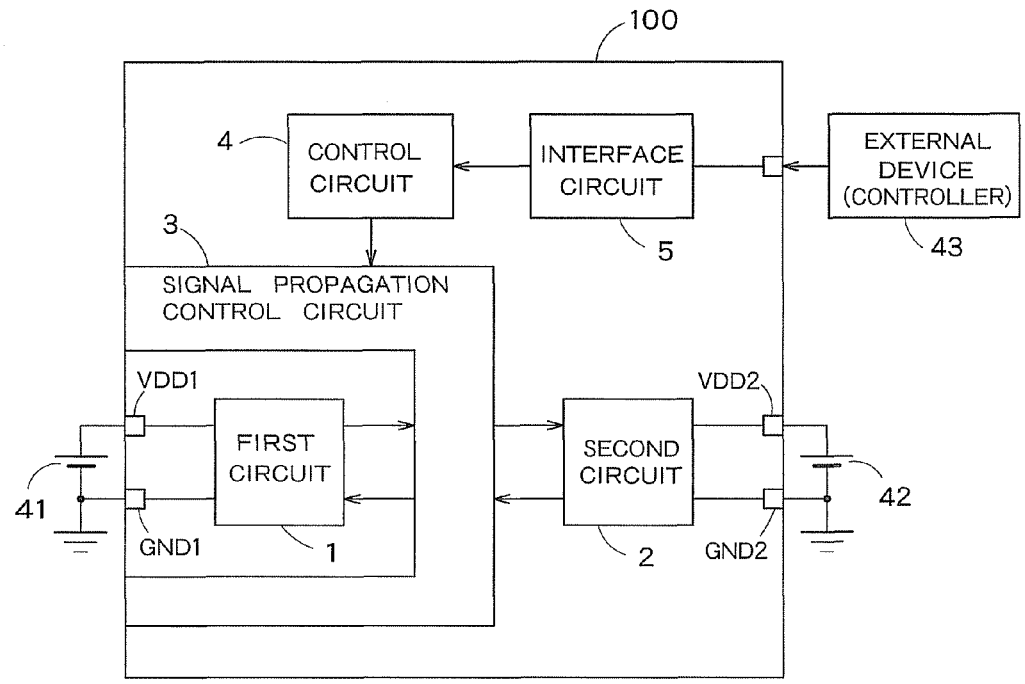
FIG. 3 is a block diagram showing an example of the connection of the semiconductor integrated circuit 100 when the first circuit 1 is used.

FIG. 3 is a block diagram showing an example of the connection of the semiconductor integrated circuit 100 when the first circuit 1 is used. As shown in FIG. 3, a power supply 41 is connected between the power supply terminal VDD1 and the ground terminal GND1 of the first circuit 1. Furthermore, a power supply 42, which is different from the power supply 41, is connected between the power supply terminal VDD2 and the ground terminal GND2 of the second circuit 2. Additionally, an external device (control device) 43 is connected to the control circuit 4 through the interface circuit 5. The external device 43 is a host processor, for example. The host processor sends commands to control the operation of the semiconductor integrated circuit 100 or receives information of the state of the semiconductor integrated circuit 100 and so on, and is a necessary device regardless of application of the present embodiment.

Figure 4:
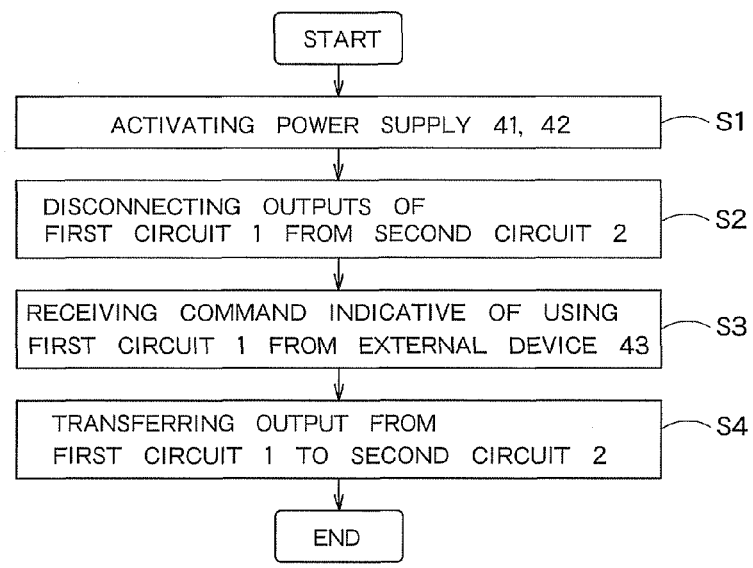
FIG. 4 is a flowchart showing an example of the controlling sequence of the semiconductor integrated circuit 100 when the first circuit 1 is used.

FIG. 4 is a flowchart showing an example of the controlling sequence of the semiconductor integrated circuit 100 when the first circuit 1 is used. Firstly, the power supplies 41 and 42 are activated (Step S1). At the moment when the power supplies 41 and 42 are ramping up, the control circuit 4 dose not have information whether the first circuit 1 is used or not. Therefore, the control circuit 4 is so designed that the voltage of the control signal is the ground voltage at the initial state. Because of this, the signal propagation control circuit 3 masks the output signals from the first circuit 1 and provides fixed voltages to the terminals of the second circuit 2 (Step S2). As the result uncertain voltages or high impedance states do not propagate to the second circuit 2.

During the ramp-up of the power supply 41 to the first circuit 1, the output signals of the first circuit 1 may be unstable and the first circuit 1 may output false values or the uncertain values. If the signal propagation control circuit 3 transfers the output signals from the first circuit 1 to the second circuit 2 during the ramp-up of the power supply 41, the false values or the uncertain values may be connected to the second circuit 2. If the false value or the uncertain values are fed into the second circuit 2, the second circuit 2 may malfunction and result in overload of the power supply because of unexpected large leakage power consumption.

On the other hand, in the present embodiment, the signals from the first circuit 1 to the second circuit 2 are blocked during the ramp-up of the power supply. Therefore, the power consumption at the ramp-up of the semiconductor integrated circuit 100 can be reduced, and it is possible to prevent potential malfunction of the second circuit 2.

After that, the control circuit 4 receives commands from the external device 43 through the interface circuit 5. In FIG. 3, it is assumed that the first circuit 1 is used, and in this case, at least one command includes an indication to use the first circuit 1 (Step S3).

When the control circuit 4 reads the command, the control circuit 4 sets the control signal to the power supply voltage in order to used the first circuit 1. Because of this, the signal propagation control circuit 3 transfers the signals from the first circuit 1 to the second circuit 2 (Step S4).

By above processing, after the power supplies 41 and 42 become stable, the output signal from the first circuit 1 is connected to the second circuit 2, and the semiconductor integrated circuit 100 can operate normally.

Note that it is preferable that the control signal is set to the power supply voltage after the operations of the first and the second circuits 1 and 2 become stable. Because the first circuit 1 and second circuit 2 may not be powered simultaneously and if signals are transferred when one of the circuits is not supplied with the power supply, it is likely that this circuit may malfunction. The control circuit 4 may set the control signal to the power supply voltage after detecting that the first and the second circuit 1 and 2 operate normally, or after a predetermined period.

FIG. 5 is a block diagram showing an example of the connection of the semiconductor integrated circuit 100 when the first circuit 1 is not used. In this case, different from FIG. 3, the power supply is not connected to the first circuit 1.

FIG. 6 is a flowchart showing an example of the controlling sequence of the semiconductor integrated circuit 100 when the first circuit 1 is not used. Firstly, the power supply is activated (Step S11). Because the control signal generated by the control circuit 4 is designed to be the ground voltage at the initial state, the signal propagation control circuit 3 masks the outputs from the first circuit 1 and does not transfer them to the second circuit 2 (Step S12). In this case, because the first circuit 1 is not provided with the power, the first circuit 1 may output signals of uncertain value or high impedance. However, the output signals of the uncertain value or high impedance state are not transferred to the second circuit 2, and the signals from the first circuit 1 to the second circuit 2 are fixed to either of power supply voltage or the ground voltage.

Next, the control circuit 4 receives commands from the external device 43 (Step S13). When the first circuit 1 is not used, no commands include any indication to use the first circuit 1. Therefore, the control circuit 4 keeps the control signal at ground voltage, and the signal propagation control circuit 3 does not transfer the outputs from the first circuit 1 to the second circuit 2 (Step S14).

By above processing, only the second circuit 2 in the semiconductor integrated circuit 100 operates. Note that because the control circuit 4 sets the control signal to the ground voltage during the ramp-up of the power supply, it is unnecessary to issue a command indicative of not using the first circuit 1 from the external device 43.

As stated above, in the first embodiment, the control circuit 4 implemented on the semiconductor integrated circuit 100 controls the signal propagation control circuit 3. Therefore, a dedicated terminal to control the signal propagation control circuit 3 is not necessary. Furthermore, when the first circuit 1 is not used, the control circuit 4 controls the signal propagation control circuit 3 so that the output signals from the first circuit 1 are not transferred to the second circuit 2. Therefore, it is unnecessary to supply the power supply to the first circuit 1, and the leakage current caused by connecting the signals of uncertain value or high impedance to the second circuit 2 can be suppressed, thereby reducing the total power consumption. Additionally, the signal propagation control circuit 3 is controlled so that the output signals from the first circuit 1 are not transferred to the second circuit 2 during the ramp-up of the power supply regardless of the usage of the first circuit 1. Therefore, the power consumption during the ramp-up of the power supply can be reduced, and potential malfunction of the second circuit 2 can be avoided.

Second Embodiment

In the first embodiment, only the output signals from the first circuit 1 are controlled whether to be connect to the second circuit 2 or not. On the other hand, in a second embodiment, which will be described below, the output signals from the second circuit 2 are also controlled whether to be connected to the first circuit 1.

In the present embodiment, although the schematic configuration of the semiconductor integrated circuit 100 is similar to that of FIG. 1, the internal configuration of the signal propagation control circuit 3 is different. FIG. 7 is a circuit diagram showing an example of the internal configuration of the signal propagation control circuit 3a. In FIG. 7, components common to those in FIG. 2 have the same reference numerals, respectively. Hereinafter, components different from FIG. 2 will be mainly described below.

The signal propagation control circuit 3a of FIG. 7 further has an AND circuit 33 and an OR circuit 34 in addition to the signal propagation control circuit 3 in FIG. 2. The signal propagation control circuit 3a controls not only the propagation of the signals from the first circuit 1 to the second circuit 2, but also the signal propagation from the second circuit 2 to the first circuit 1. When the signal propagation control circuit 3a does not transfer the signals from the second circuit 2 to the first circuit 1, the signal propagation control circuit 3a provides fixed values of the power supply voltage or the ground voltage to the first circuit 1. Furthermore, the control circuit 4 supplies a control signal (second control signal) to the AND circuit 33 and the OR circuit 34 in the signal propagation control circuit 3a. The control signal indicates whether to transfer the signals from the second circuit 2 to the first circuit 1 or not.

The control signal and an output signal from an output terminal 23 of the second circuit 2 are connected to the input terminals of the AND circuit 33, and the output signal thereof is connected to an input terminal 13 of the first circuit 1. The AND circuit 33 controls whether to transfer the output signal from the second circuit 2 to the first circuit 1 or provides the fixed values of the ground voltage. The direction of the signal flow is opposite compared with the AND circuit 31.

The control signal and an output signal from an output terminal 24 of the second circuit 2 are connected to the input terminals of the OR circuit 34, and the output signal thereof is connected to an input terminal 14 of the first circuit 1. The OR circuit 34 controls whether to connect the output signal from the second circuit 2 to the first circuit 1 or provide the fixed value of the power supply voltage. The direction of the signal flow is opposite compared with the OR circuit 32.

Similar to the first embodiment, when the voltage used in the first circuit 1 is different from that used in the second circuit 2, the AND circuit 33 and the OR circuit 34 also have, if needed, a voltage shifting function. For example, when the power supply voltage VDD1 is different from the power supply voltage VDD2, the voltage of the input terminals of the AND circuit 33 and the OR circuit 34 is the ground voltage or the power supply voltage VDD2, while the voltage of the output terminals is the ground voltage or the power supply voltage VDD1, and the signal propagation control circuit 3a is so designed that undesired leakage current does not occur even if the voltage shifting function is implemented.

The semiconductor integrated circuit 100 having the signal propagation control circuit 3a of FIG. 7 uses a similar controlling sequence shown in FIG. 4 or FIG. 6. In Step S2 of FIG. 4 or Step S12 of FIG. 6, the signal propagation control circuit 3a controls both of the inputs and outputs of the first circuit 1. In Step S4 of FIG. 4, the signal propagation control circuit 3a transfers the input signals of both the first circuit 1 and the second circuit 2.

When the first circuit 1 is used, by masking the output signals from the second circuit 2 during the ramp-up period of the power supplies (corresponding to Step S2 of FIG. 4), it is possible to suppress the instantaneous leakage current in the first circuit 1 or the potential malfunction of the first circuit 1.

Furthermore, when the first circuit 1 is not used, by masking the outputs from the second circuit 2 (corresponding to Step S12 of FIG. 6), it is possible to suppress the leakage current in the first circuit 1. In a case where the first circuit 1 is not supplied with the power and all the input terminals of the first circuit 1 are connected to gates of MOS transistors and so on, little leak current flows in the first circuit 1 regardless of the voltage level at the input terminals. However, when an input terminal is connected to a drain of a PMOS transistor in some circuit, the leakage current flows from the drain to the substrate in case when the input terminal voltage becomes the supply voltage and power is not supplied to the first circuit 1. On the other hand, by implementing the AND circuit 33 in the signal propagation control circuit 3a and providing the input terminal with the ground voltage, the leakage current can be suppressed.

As stated above, in the second embodiment, the control circuit 4 can control the signal propagation control circuit 3a so that the output signals from the second circuit 2 are not transferred to the first circuit 1. Therefore, the power consumption can be further reduced, and potential malfunction of the first circuit 1 can be prevented.

In FIG. 3, an example is shown where the external device 43 controls the semiconductor integrated circuit 100. In this case, by defining commands to control the signal propagation control circuit 3 on the interface circuit 5, the output signals of the first circuit 1 can be dynamically controlled to be connected or disconnected to the second circuit 2 by issuing one of the commands from the external device 43.

On the other hand, if the dynamic control of the output signals of the first circuit 1 is not necessary, various modifications can be conceived. FIG. 8 is a block diagram showing an example of the connection of the semiconductor integrated circuit 100 when a firmware for controlling the semiconductor integrated circuit 100 is stored in an external memory 44. The interface circuit 5 in this case is an interface which can communicate with the external memory 44.

The control circuit 4 receives the commands to be executed from the external memory 44 through the interface circuit 5. If at least one of the commands includes an indication to use the first circuit 1, the control circuit 4 controls the signal propagation control circuit 3 to allow the signals to be transferred between the first circuit 1 and the second circuit 2, similar to the above described operation. On the other hand, if no commands includes the indication to use the first circuit 1, the control circuit 4 keeps the signal propagation control circuit 3 to be in the initial state not to transfer the signals between the first circuit 1 and the second circuit 2, and to provide the predetermined fixed values.

FIG. 9 is a block diagram showing an example of the connection of the semiconductor integrated circuit 100 when the firmware is stored in an integrated non-volatile memory 6. In this case it doesn't matter whether the interface circuit 5 is integrated or not.

Furthermore, in FIG. 1 and so on, an example is shown where the semiconductor integrated circuit 100 has only two circuits, namely, the first circuit 1 and the second circuit 2. However the semiconductor integrated circuit 100 can have more than two circuits such as the first circuit 1 which can be selected to be used or not according to the application and can have more than two circuits such as the second circuit 2 which are always used regardless of the application. Especially, as the semiconductor integrated circuit 100 has more functions, the power consumption of each circuit block is larger. Therefore, it becomes more important to power down unused circuits by controlling the propagation of signals between the unused circuits and used circuits.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

The invention claimed is:

1. A semiconductor integrated circuit comprising:
   a first circuit configured to comprise a first power supply terminal;
   a second circuit configured to comprise a second power supply terminal independent of the first power supply terminal; and
   a signal propagation control circuit configured to provide a first fixed value to the second circuit for a predetermined period after a power supply is activated to the second circuit, and after the predetermined period, configured to control whether to transfer an output signal from the first circuit to the second circuit or provide the first fixed value to the second circuit.

2. The circuit of claim 1, further comprising:
   an interface circuit configured to be an interface with an external device; and
   a control circuit configured to control the signal propagation control circuit in such a manner that the output signal from the first circuit is transferred to the second circuit when the control circuit receives a signal requesting usage of the first circuit from the external device through the interface circuit.

3. The circuit of claim 2, wherein the control circuit is configured to provide the signal propagation control circuit with a first control signal indicative of whether to transfer the output signal from the first circuit to the second circuit or provide the first fixed value to the second circuit, and
the signal propagation control circuit comprises at least one of an AND circuit or an OR circuit,
wherein the first control signal and the output signal from the first circuit are connected to input terminals of the AND circuit and an output of the AND circuit is connected to the second circuit, and
an inverted signal of the first control signal and the output signal from the first circuit are connected to input terminals of the OR circuit and an output of the OR circuit is connected to the second circuit.

4. The circuit of claim 3, wherein each of voltages of input signals of the AND circuit and the OR circuit is a power supply voltage of the first circuit or a ground voltage, and
each of voltages of output signals of the AND circuit and the OR circuit is a power supply voltage of the second circuit or the ground voltage.

5. The circuit of claim 1, further comprising:
a non-volatile memory; and
a control circuit configured to control the signal propagation control circuit in such a manner that the output signal from the first circuit is transferred to the second circuit when the control circuit receives a signal requesting usage of the first circuit from the non-volatile memory.

6. The circuit of claim 5, wherein the control circuit is configured to provide the signal propagation control circuit with a first control signal indicative of whether to transfer the output signal from the first circuit to the second circuit or provide the first fixed value to the second circuit, and
the signal propagation control circuit comprises at least one of an AND circuit or an OR circuit,
wherein the first control signal and the output signal from the first circuit are connected to input terminals of the AND circuit and an output of the AND circuit is connected to the second circuit, and
an inverted signal of the first control signal and the output signal from the first circuit are connected to input terminals of the OR circuit and an output of the OR circuit is connected to the second circuit.

7. The circuit of claim 6, wherein each of voltages of input signals of the AND circuit and the OR circuit is a power supply voltage of the first circuit or a ground voltage, and
each of voltages of output signals of the AND circuit and the OR circuit is a power supply voltage of the second circuit or the ground voltage.

8. The circuit of claim 1, wherein the signal propagation control circuit is configured to provide a second fixed value to the first circuit for the predetermined period after the power supply is activated to the second circuit, and after the predetermined period, configured to control whether to transfer an output signal from the second circuit to the first circuit or provide the second fixed value to the first circuit.

9. The circuit of claim 8, further comprising:
an interface circuit configured to be an interface with an external device; and
a control circuit configured to control the signal propagation control circuit in such a manner that the output signal from the second circuit is transferred to the first circuit when the control circuit receives a signal requesting usage of the first circuit from the external device through the interface circuit.

10. The circuit of claim 9, wherein the control circuit is configured to provide the signal propagation control circuit with a second control signal indicative of whether to transfer the output signal from the second circuit to the first circuit or provide the second fixed value to the first circuit, and
the signal propagation control circuit comprises at least one of an AND circuit or an OR circuit,
wherein the second control signal and the output signal from the second circuit are connected to input terminals of the AND circuit and an output of the AND circuit is connected to the first circuit, and
an inverted signal of the second control signal and the output signal from the second circuit are connected to input terminals of the OR circuit and an output of the OR circuit is connected to the first circuit.

11. The circuit of claim 10, wherein each of voltages of input signals of the AND circuit and the OR circuit is a power supply voltage of the second circuit or a ground voltage, and
each of voltages of output signals of the AND circuit and the OR circuit is a power supply voltage of the first circuit or the ground voltage.

12. The circuit of claim 8, further comprising:
a non-volatile memory; and
a control circuit configured to control the signal propagation control circuit in such a manner that the output signal from the second circuit is transferred to the first circuit when the control circuit receives a signal requesting usage of the first circuit from the non-volatile memory.

13. The circuit of claim 12, wherein the control circuit is configured to provide the signal propagation control circuit with a second control signal indicative of whether to transfer the output signal from the second circuit to the first circuit or provide the second fixed value to the first circuit, and
the signal propagation control circuit comprises at least one of an AND circuit or an OR circuit,
wherein the second control signal and the output signal from the second circuit are connected to input terminals of the AND circuit and an output of the AND circuit is connected to the first circuit, and
an inverted signal of the second control signal and the output signal from the second circuit are connected to input terminals of the OR circuit and an output of the OR circuit is connected to the first circuit.

14. The circuit of claim 13, wherein each of voltages of input signals of the AND circuit and the OR circuit is a power supply voltage of the second circuit or a ground voltage, and
each of voltages of output signals of the AND circuit and the OR circuit is a power supply voltage of the first circuit or the ground voltage.

15. The circuit of claim 1, wherein the first fixed value is a power supply voltage of the second circuit or a ground voltage.

16. A system of controlling a semiconductor integrated circuit comprising:
a semiconductor integrated circuit; and
a control device configured to control the semiconductor integrated circuit;
wherein the semiconductor integrated circuit comprises:
a first circuit configured to comprise a first power supply terminal;
a second circuit configured to comprise a second power supply terminal independent of the first power supply terminal;

a signal propagation control circuit configured to provide a first fixed value to the second circuit for a predetermined period after a power supply is activated to the second circuit, and after the predetermined period, configured to control whether to transfer an output signal from the first circuit to the second circuit or provide the first fixed value to the second circuit;

an interface circuit configured to be an interface with the control device; and a control circuit configured to control the signal propagation control circuit in such a manner that the output signal from the first circuit is transferred to the second circuit when the control circuit receives a signal requesting usage of the first circuit from the control device through the interface circuit.

17. The system of claim 16, wherein the control circuit is configured to provide the signal propagation control circuit with a first control signal indicative of whether to transfer the output signal from the first circuit to the second circuit or provide the first fixed value to the second circuit, and the signal propagation control circuit comprises at least one of an AND circuit or an OR circuit, wherein the first control signal and the output signal from the first circuit are connected to input terminals of the AND circuit and an output of the AND circuit is connected to the second circuit, and an inverted signal of the first control signal and the output signal from the first circuit are connected to input terminals of the OR circuit and an output of the OR circuit is connected to the second circuit.

18. The system of claim 16, wherein the signal propagation control circuit is configured to provide a second fixed value to the first circuit for the predetermined period after the power supply is activated to the second circuit, and after the predetermined period, configured to control whether to transfer an output signal from the second circuit to the first circuit or provide the second fixed value to the first circuit.

19. The system of claim 18, wherein the control circuit is configured to provide the signal propagation control circuit with a second control signal indicative of whether to transfer the output signal from the second circuit to the first circuit or provide the second fixed value to the first circuit, and the signal propagation control circuit comprises at least one of an AND circuit or an OR circuit, wherein the second control signal and the output signal from the second circuit are connected to input terminals of the AND circuit and an output of the AND circuit is connected to the first circuit, and an inverted signal of the second control signal and the output signal from the second circuit are connected to input terminals of the OR circuit and an output of the OR circuit is connected to the first circuit.

20. The system of claim 16, wherein the first fixed value is a power supply voltage of the second circuit or a ground voltage.

* * * * *